United States Patent [19]

Klein et al.

[11] 3,950,677

[45] Apr. 13, 1976

[54] HOUSING MOUNTING ARRANGEMENT FOR GROUND FAULT CIRCUIT INTERRUPTER

[75] Inventors: Keith William Klein; Edward Keith Howell, both of Simsbury; Joseph Michael Palmieri, Southington, all of Conn.

[73] Assignee: General Electric Company, New York, N.Y.

[22] Filed: Oct. 30, 1974

[21] Appl. No.: 519,076

[52] U.S. Cl. ............... 317/120; 174/52 R; 336/175; 317/18 D; 317/101 R

[51] Int. Cl.$^2$ ........................................ H05K 5/02

[58] Field of Search ...... 200/293, 304, 305; 317/99, 317/101 CB, 101 R, 101 DH, 120, 18 D; 174/52 R; 335/18, 202; 336/84, 174, 175

[56] References Cited

UNITED STATES PATENTS

| | | | |
|---|---|---|---|
| 2,991,356 | 7/1961 | Harasek | 174/52 R |
| 3,654,543 | 4/1972 | Isogai | 336/174 |
| 3,684,817 | 8/1972 | Card, Jr. | 174/52 R |
| 3,701,003 | 10/1972 | Anderson | 336/175 |
| 3,771,024 | 11/1973 | Dumas | 317/120 |
| 3,789,268 | 1/1974 | Klein | 317/58 |
| 3,855,504 | 12/1974 | Olashaw | 317/120 |

*Primary Examiner*—Gerald P. Tolin
*Attorney, Agent, or Firm*—Robert A. Cahill; Walter C. Bernkopf; Frank L. Neuhauser

[57] ABSTRACT

An electronic module for use in ground fault circuit interrupting devices comprises an improved shell design structurally adapted for ease of assembly therein of the electronics and magnetics. The electronics, carried on a printed circuit board, is positionally mounted and retained in one shell compartment by integrally formed latching means. The magnetics are positionally mounted in other shell compartments and locked in place by the insertion therethrough of single-turn transformer winding elements. Potting of the electronics and magnetics thus becomes unnecessary.

7 Claims, 8 Drawing Figures

HOUSING MOUNTING ARRANGEMENT FOR GROUND FAULT CIRCUIT INTERRUPTER

BACKGROUND OF THE INVENTION

Ground fault circuit interrupting (GFCI) devices have recently been developed in ratings suitable for implementation in residential circuits. These GFCI devices typically include, in addition to ground fault protection, overload and short circuit protection. All of these protective features are packaged in a molded case comparable in size to a conventional circuit breaker, such that GFCI devices can be accommodated in existing circuit breaker load centers.

Ground fault protection is afforded by a so-called "module" which energizes a trip solenoid to initiate circuit interruption. To provide adequate protection in terms of preventing personal injury, the GFCI module must respond to high impedance line to ground faults where the fault current is quite small, e.g., 5 to 6 milliamps. Fault currents in excess of 5 to 6 milliamps flowing through the body for even a short duration can produce harmful and even fatal consequences.

A GFCI module basically includes a current sensor, a signal processor and an electronic switch. The current sensor is in the form of a differential current transformer which responds to a current imbalance in the line and neutral conductors of the distribution circuit, as is occasioned by leakage current flowing from the line conductor through a fault to ground and back to the source over a circuit path other than the neutral conductor. The transformer response to this current imbalance or differential is amplified by the signal processor pursuant to triggering the electronic switch, typically a silicon controlled rectifier, and thereby complete an energization circuit for the trip solenoid. With the extremely low signal levels involved, the signal processor must be relatively sophisticated in design and include provisions for rejecting electrical noise in order to provide reasonable immunity to nuisance tripping.

In addition to tripping in the event of a line to ground fault, GFCI devices are required to trip in the event of a low impedance ground fault on the neutral conductor. This is done to guard against the possible desensitizing effect that a neutral ground fault has on the current sensor. That is, should the line and neutral conductors both experience ground faults, some of the current flowing through the lineground fault could return to the source through the neutral-ground fault and the neutral conductor. The current differential seen by the current sensor would not therefore be a true measure of the ground fault current magnitude, and the GFCI device would not trip even though the fault current exceeded the 5–6 milliamp trip level. To also sense a neutral ground fault, the module is further typically equipped with a second transformer which is energized to induce an imbalancing current flow in the neutral conductor of sufficient magnitude to precipitate a ground fault trip function in the event the neutral conductor experiences a ground fault.

It will be appreciated that assembly of the component parts of a GFCI module having all of these requisite capabilities into a compact package of small physical size is an exacting task which contributes significantly to the overall manufacturing cost of GFCI devices, such as GFCI circuit breakers.

It is accordingly an object of the present invention to provide a GFCI device having an improved module incorporated therein.

Another object is to provide a GFCI module designed to facilitate assembly of its component parts into a compact package of small physical size.

Yet another object is to provide a GFCI module of the above character wherein the assemblage of its component parts is maintained without resorting to potting.

A further object is to provide a GFCI module of the above character with improved shielding against RF noise which could precipitate nuisance tripping of the GFCI device.

Other objects of the invention will become apparent from the following detailed description and claims.

SUMMARY OF THE INVENTION

In accordance with the present invention, there is provided a ground fault circuit interrupting (GFCI) device, such as a circuit breaker, which incorporates an improved module facilitating assembly of the component parts thereof. The module includes magnetics and electronics, both accommodated in a shell. The electronics, mounted on a circuit board, is accommodated in one compartment of the shell. The shell is structurally adapted to provide a resilient latch for retaining the electronics positioned in its compartment. The magnetics consists of a differential current transformer and a neutral oscillator transformer, each accommodated in separate shell compartments. The shell is provided with resilient means for engaging the transformers upon insertion in their respective compartments, retaining them in position for subsequent assembly operations. The core apertures of the two transformers, retained in their respective shell compartments, are aligned such as to accommodate the insertion therethrough of single turn winding elements. Intermediate the transformer compartments, the shell is formed to provide a bounded opening through which the winding elements also pass, thereby effectively locking the magnetics in place.

An additional feature of the invention, the differential transformer, is encompassed by a cup-shaped conductive magnetic shield to prevent RF noise and external magnetic fields from being coupled into the secondary winding thereof.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

Like reference numerals refer to corresponding parts throughout the several views of the drawings.

DETAILED DESCRIPTION

Figure 1:
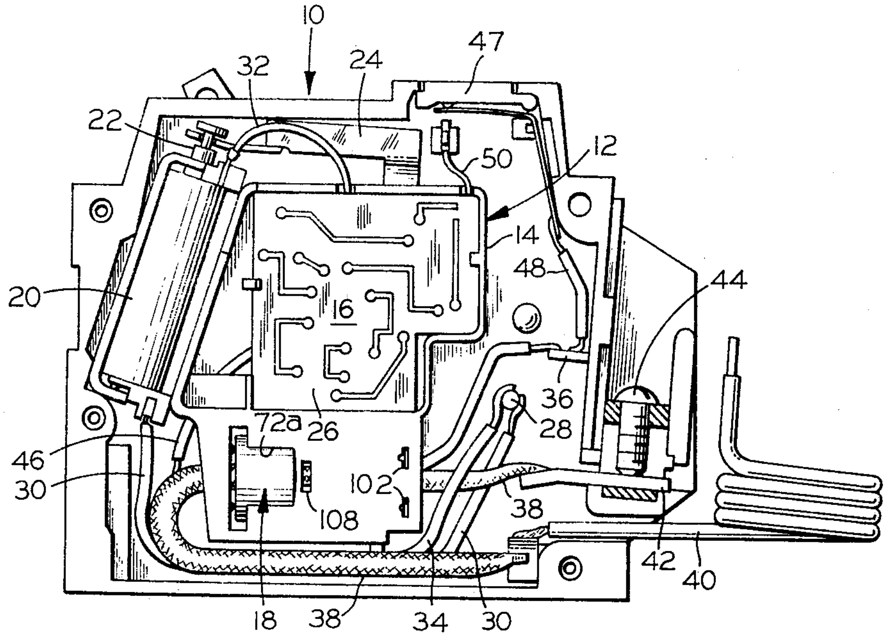
FIG. 1 is a side elevational view of a GFCI circuit breaker, with cover removed to expose a GFCI module embodying the present invention.

The present invention is illustrated as being embodied in a ground fault circuit interrupting (GFCI) circuit breaker of the type disclosed in U.S. Pat. No. 3,789,268, assigned to the assignee of the instant application. As seen from the disclosure of this patent, which disclosure is expressly incorporated herein by reference, the GFCI circuit breaker is housed in an insulative case consisting of two case sections and a cover. One of these case sections houses the circuit breaker proper which includes separable contacts, an operating mechanism and a trip mechanism, all of which may be of conventional circuit breaker design such as shown, for example, in U.S. Pat. No. 3,464,040, also assigned to the assignee of the present application.

The other case section, together with the cover, enclosed those components devoted to providing the ground fault protective function. The major one of these components is a GFCI module, which is generally indicated at 12 in FIG. 1 herein. This GFCI module includes a shell 14 for accommodating the electronics and magnetics, respectively generally indicated at 16 and 18. Also included in this section of the GFCI circuit breaker case 10 is a trip solenoid 20 which is selectively energized under the control of the module 12 to initiate a ground fault trip function. More specifically, a trip solenoid plunger 22 engages one end of a link 24 extending into the circuit breaker section of case 10. Thus, upon energization of the trip solenoid, its plunger is attracted to move the link into tripping engagement with a latch (not shown), thereby releasing the circuit breaker operating mechanism to initiate circuit interruption.

Still referring to FIG. 1, power for the GFCI electronics 16, mounted on a printed circuit board 26, is obtained from a conductive post 28 via lead 30, trip solenoid 20, and lead 32. Post 28 extends laterally into the circuit breaker section of the case 10 where it is electrically connected to the load side of the separable contacts (not shown). Also electrically connected to post 28 is a conductor 34 which conveys line current through the magnetics portion of the GFCI module 12. The other end of this conductor is soldered to a strap 36 which extends laterally into the circuit breaker section of the case 10 to the line side load terminal of the GFCI circuit breaker. A conductive braid 38 encompasses the conductor 34 for excursion through the magnetics 18. One end of braid 38 is connected to one end of a pigtail conductor 40, whose other end, upon installation of the GFCI circuit breaker, is connected to a neutral bus (not shown) of a circuit breaker load center. The other end of braid 38 is connected to a strap 42 included in a neutral side load terminal, generally indicated at 44, of the GFCI circuit breaker. A lead 46 from the electronics 16 to braid 38 completes the module connections for energization from the distribution circuit for which grounded fault protection is afforded.

Still referring to FIG. 1, to verify the operability of the GFCI circuit breaker, a test switch 47 is connected between strap 36, electrically common to the load side line terminal, and the module electronics 16 by leads 48 and 50. The electronics includes a suitably valued resistor (not shown) electrically connected in series between leads 46 and 50, such that closure of the test switch 47 simulates a ground leakage current of the prescribed trip level, e.g., 5 milliamperes, in response to which the GFCI circuit breaker should trip.

Figure 2:
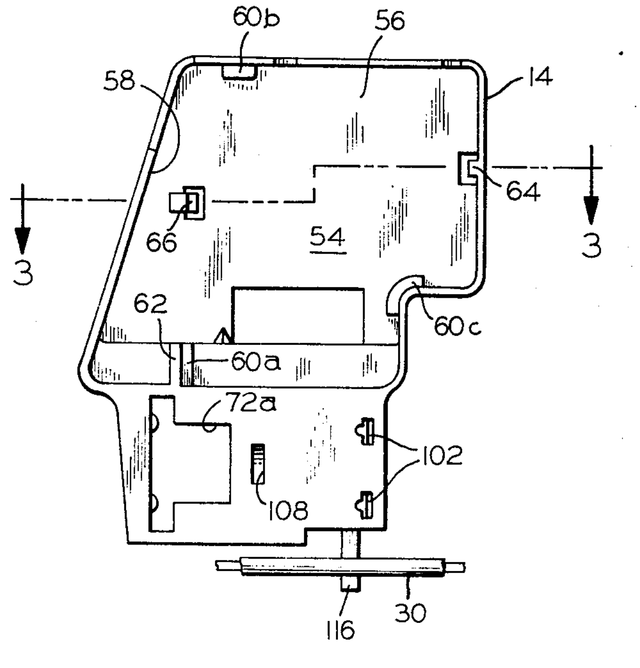
FIG. 2 is a one side elevational view of the module shell with the electronics and magnetics removed.
Figure 3:
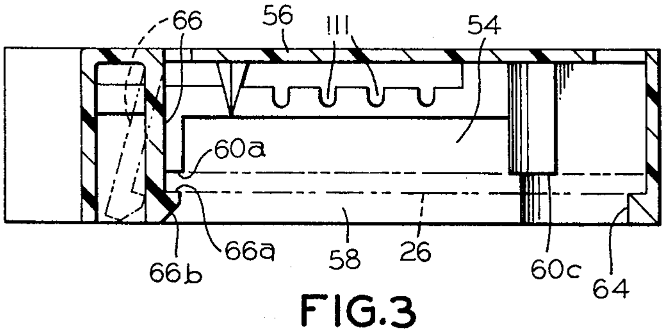
FIG. 3 is a sectional view taken along line 3—3 of FIG. 2.

Turning to FIGS. 2 and 3, insulative shell 14, molded in plastic in a generally tray-like configuration, is formed with a compartment 54 defined by a floor 56 and essentially continuous sidewall 58. Ledges **60*a*, 60*b* and 60*c*, molded with the compartment sidewall 58 support the printed circuit board 26 in spaced relation to the compartment floor, as best seen in FIG. 3, so as to afford clearance for the electronic components mounted to the circuit board. Molded rib 62, seen in FIG. 2, together with the compartment sidewall 58 serve to locate the position of the electronics in compartment 54. As best seen in FIG. 3, a tab 64, molded in the free edge of sidewall 58, together with an integrally formed resilient latching finger 66, then serve to retain the once located electronics 16 in compartment 54. In assembly, one edge of printed circuit board 26 is firt caught under tab 64 and the opposite edge is caught under a latch surface 66*a* formed in the termination of resilient finger 66. To facilitate assembly, the termination of resilient finger 66 is provided with an angular surface 66*b* which is engaged by the edge portion of the printed circuit board 26 as the electronics is pressed into place to cam the barbed termination of finger 66 to the left as seen in phantom in FIG. 3. When the edge of the circuit board clears latching surface 66*a*, the finger 66 springs back to its normal erect orientation with its latching surface then engaging the circuit board. It is thus seen that circuit board 26 is trapped between tab 64, finger 66, and ledges 60*a*, 60*b*, 60*c* for positive retention in compartment 54, without the necessity for the application of a potting material. The elimination of potting not only reduces direct manufacturing costs, but also renders the salvaging of the electronics 16** from otherwise defective modules economically practicable.

Figure 4:
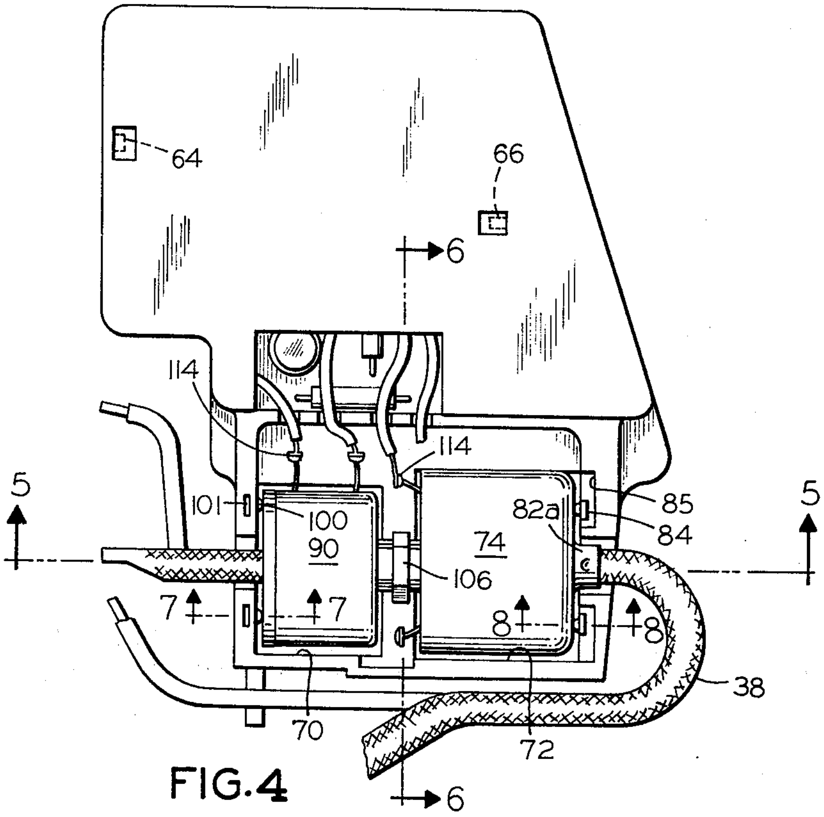
FIG. 4 is an opposite side elevational view of the GFCI module shell with magnetics in place.
Figure 5:
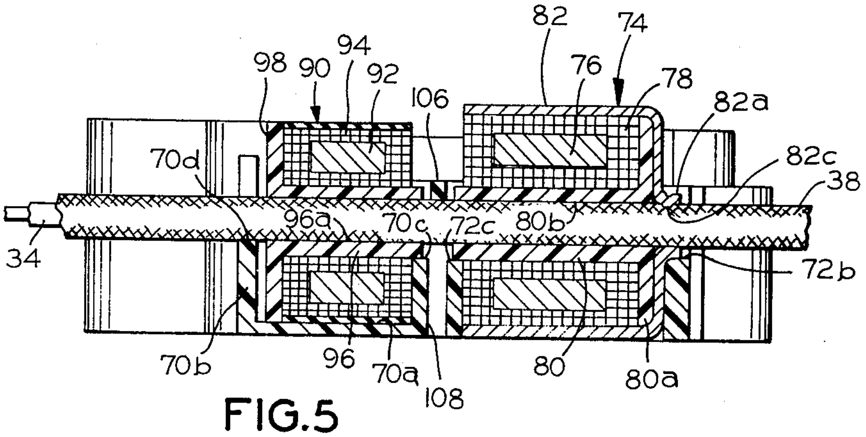
FIG. 5 is a sectional view taken along line 5—5 of FIG. 4.

To accommodate the GFCI magnetics 18, shell 14 is formed to provide a pair of compartments 70 and 72, as seen in FIG. 4. These compartments are open to the reverse side of the module shell 14 from the opening to electronics compartment 54. Compartment 72 accommodates a differential current transformer, generally indicated at 74, for sensing a current imbalance in conductor 34 and braid 38 which, in application, carry the currents in the line and neutral sides, respectively, of the distribution circuit. As seen in the sectional view of FIG. 5, the differential transformer includes a toroidal core 76, on which is wound a multi-turn secondary winding 78. The wound core is mounted coaxially on a spool 80 equipped at one end with an annular flange **80*a*. According to a feature of the present invention, a magnetically and electrically conductive, cup-shaped shield 82 surrounds the wound core to prevent the coupling of external magnetic fields and RF noise into the transformer secondary winding 78. Conductor 34 and braided conductor 38 are passed through an axial bore 80*b* in spool 80 to constitute separate, single-turn primary windings for the differential current transformer 74. While conductors 34 and 38 are in coaxial relationship during the single pass through the differential current transformer simply to conserve space, it will be appreciated that these conductors can be in side-by-side relation. In order to provide a lower profile, a portion of the floor for compartment 72 is removed, as indicated at 72***a* in FIGS. 1 and 2, to provide an opening accommodating the lower peripheral portion of the differential current transformer. To support and position the differential current transformer 74 in compartment 72, shield 82 is provided with an axially extending annular collar 82*a* which seats in a semi-circular depression 72*b* formed in one endwall of compartment 72. At the other end of the differential current transformer, spool 80 extends beyond the termination of shield 82 so as to rest in another semi-circular depression 72*c* formed in the opposite compartment endwall. At one or more locations, collar 82*a* of shield 82 is dimpled, as indicated in FIG. 5, so as to insure electrical contacting engagement with braided conductor 38. Thus RF noise voltage intercepted by shield 82 is conducted to ground via the braided conductor 38 and the neutral side of the electrical source, which, according to conventional practice is grounded at the load center.

Figure 8:
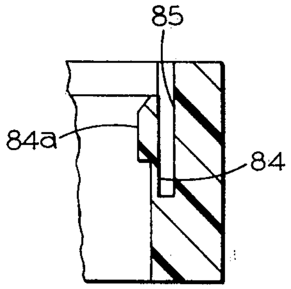
FIG. 8 is a sectional view taken along line 8—8 of FIG. 4.

As seen in FIGS. 4 and 8, the compartment endwall is integrally formed to provide, on each side of depression 72*b*, a resilient finger 84 upstanding in a wall recess 85. Each finger carries a protuberance 84*a* which resiliently engages shield 82 so as to frictionally retain transformer 74 in compartment 72.

The other magnetics compartment 70 in shell 14 accommodates a neutral excitation transformer, generally indicated at 90. As seen in FIG. 5, this transformer includes a toroidal core 92 on which is wound a multi-turn primary winding 94. The wound core is mounted on a spool 96 provided with an annular flange 98 at one end. The lower peripheral portion of flange 90 rests on the floor 70*a* of compartment 70, while the other end of spool 96 extends beyond the wound core to rest on a semi-circular depression 70*c* provided in the end wall common to compartments 70 and 72.

Figure 7:
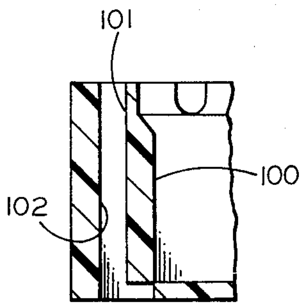
FIG. 7 is a sectional view taken along line 7—7 of FIG. 4.

The neutral excitation transformer 90 is detained in its compartment by a pair of resilient tabs 100 molded into the endwall 70*b* of compartment 70. As seen in FIGS. 4 and 7, each tab 100 is carried on a narrow wall segment 101 which is separated from the main endwall 70*b* by a rectangular through-slot 102. The lower end of wall segment 101 is not joined to the floor 70*a* of compartment 70 so as to enhance flexibility. When the neutral transformer 90 is inserted in its compartment 70, the tabs 100 press against the spool flange 98 to retain the transformer in its compartment until the conductors 34 and 38 are inserted through the spool bores in a subsequent assembly step.

Figure 6:
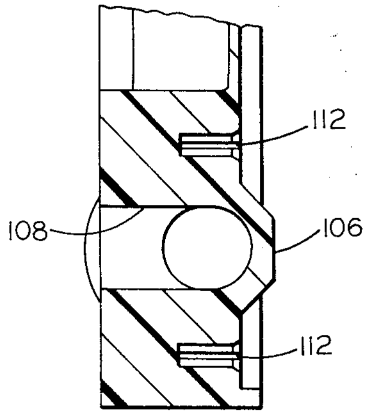
FIG. 6 is a sectional view taken along line 6—6 of FIG. 4.

According to a feature of the invention, the common wall between compartments 70 and 72 is molded to provide an arch 106 (FIG. 6) intermediate the semi-circular depressions 70*c* and 72*c*. The material for arch 106 is taken from the common endwall, as evidenced by the slot 108 therein (FIG. 5). It is thus seen that upon insertion of the conductors 34 and 38 through the axial bores in transformer spools 96 and 80, the magnetics are locked into their respective compartments 70 and 72 by the bounded aperture defined by arch 106 and flanking depressions 70*c* and 72*c*. Endwall 70*b* is provided with a semi-circular depression 70*d* to accommodate conductors 34 and 38.

Referring to FIGS. 3 and 5, a portion of the floor 56 of compartment 54 is removed, as is a portion of the wall common to the electronics and magnetics compartments, so as to provide an opening 110 admitting a series of leads for electrically interconnecting the electronics and the magnetics. The leads from the electronics are lodged in notches 111 formed in the edge of the common wall at the opening. To facilitate this interconnection, the shell 14 is formed with a plurality of wells 112 (FIG. 6) into which are press fitted terminals 114 to which the leads from the electronics and the leads from the magnetics are commonly soldered. As shown in FIG. 2, shell 14 is integrally formed with a laterally extending bracket 116 which is suitably notched to receive conductor 30 running from the post 28 to solenoid 20 (FIG. 1). The retention of conductor 30 in this bracket notch serves to hold the solenoid essentially in its position against the module 12 during assembly into case 10 and the making of the electrical connection of conductor 30 to post 28.

It will thus be seen that the objects set forth above, among those made apparent in the preceding description are efficiently attained and, since certain changes may be made in the above construction without departing from the scope of the invention, it is intended that all matter contained in the above description or shown in the accompanying drawings shall be interpreted as illustrative and not in a limiting sense.

Having described our invention, what we claim as new and desire to secure by Letters Patent is:

1. A module for use in a ground fault circuit interruption device, said module comprising, in combination:

A. magnetics including a differential current transformer having a wire-wound toroidal core and a pair of conductors passing through said core to serve as single-turn winding elements;

B. signal processing electronics electrically connected to said magnetics;

C. a molded, insulated shell;

D. means forming a first compartment in said shell accommodating said electronics;

E. means forming a second compartment in said shell accommodating said differential current transformer;

F. resilient means integrally formed in at least one sidewall of said second compartment, said resilient means yielding to admit assembly of said differential current transformer in said second compartment and thereafter frictionally engaging it for retention in said second compartment; and G. means integrally formed with said shell forming an arch adjacent said second compartment under which said conductor pair pass, thereby to effectively lock said differential transformer in said second compartment.

2. The module defined in claim 1, wherein said differential transformer includes a wire-wound toroidal core encompassed by a cup-shaped electrically and magnetically conductive shield.

3. The module defined in claim 1, wherein said magnetics further include an excitation transformer having a wire-wound toroidal core, and said module further including:

A. means forming a third compartment in said shell accommodating said excitation transformer, said third compartment located adjacent said second compartment;

B. additional resilient means integrally formed in at least one sidewall of said third compartment, said additional resilient means yielding to admit assembly of said excitation transformer in said third compartment and thereafter frictionally engaging it for retention in said third compartment;

1. said pair of conductors passing through said toroidal cores of both said differential current and excitation transformers to serve as single-turn winding elements therefor, and
2. said conductor pair passing under said arch located intermediate said second and third compartments, thereby effectively locking said transformers in their respective compartments.

4. The module defined in claim 3, wherein said electronics includes an essentially rigid circuit board physically mounting and electrically interconnecting various electronic components, and said module further including latch means integrally formed with said shell, said latch means releasably engaging said circuit board to retain said electronics in said first compartment.

5. The module defined in claim 4, which further includes a plurality of ledges integrally formed on the interior of sidewalls of said first compartment, said ledges serving to support said circuit board in spaced relation to a bottom wall of said first compartment so as to provide clearance for said electronic components.

6. The module defined in claim 5, wherein said latch means includes:

1. a tab integrally formed on the interior of one said sidewall at a location spaced above said ledges by at least the thickness of said circuit board, whereby one edge of said circuit board can be captured under said tab, and
2. an integrally formed resilient finger upstanding from said bottom wall at a location opposing said tab, said finger having an enlarged free end portion undercut to provide a latching surface likewise spaced above said ledges by at least the thickness of said circuit board, said latching surface engaging another edge of said circuit board.

7. The module defined in claim 6, wherein said finger further includes a cam surface engaged by said other edge of said circuit board during assembly of said electronics in said second compartment to force the free end portion of said finger aside until said latching surface clears the upper surface of said circuit board, whereupon said finger springs back into latching engagement with said circuit board.

* * * * *